(12) United States Patent
Cheng

(10) Patent No.: US 11,243,231 B2
(45) Date of Patent: Feb. 8, 2022

(54) VERTICAL PROBE CARD

(71) Applicant: Tien-Chien Cheng, HsinChu (TW)

(72) Inventor: Tien-Chien Cheng, HsinChu (TW)

(*) Notice: Subject to any disclaimer, the term of this patent is extended or adjusted under 35 U.S.C. 154(b) by 77 days.

(21) Appl. No.: 16/695,187

(22) Filed: Nov. 26, 2019

(65) Prior Publication Data
US 2020/0191828 A1    Jun. 18, 2020

Related U.S. Application Data

(60) Provisional application No. 62/780,932, filed on Dec. 18, 2018.

(51) Int. Cl.
| | | |
|---|---|---|
| *G01R 1/073* | (2006.01) | |
| *H01L 21/48* | (2006.01) | |
| *H01L 21/56* | (2006.01) | |
| *H01L 21/768* | (2006.01) | |
| *H01L 23/31* | (2006.01) | |
| *H01L 23/373* | (2006.01) | |
| *H01L 23/40* | (2006.01) | |
| *H01L 23/473* | (2006.01) | |
| *H01L 23/00* | (2006.01) | |
| *H01L 21/304* | (2006.01) | |

(52) U.S. Cl.
CPC ........ *G01R 1/07314* (2013.01); *H01L 21/304* (2013.01); *H01L 21/486* (2013.01); *H01L 21/563* (2013.01); *H01L 21/76879* (2013.01); *H01L 23/3114* (2013.01); *H01L 23/373* (2013.01); *H01L 23/4006* (2013.01); *H01L 23/473* (2013.01); *H01L 24/13* (2013.01); *H01L 24/29* (2013.01); *H01L 2924/00* (2013.01)

(58) Field of Classification Search
CPC ................................................. G01R 1/07314
See application file for complete search history.

(56) References Cited

U.S. PATENT DOCUMENTS

| | | | | |
|---|---|---|---|---|
| 6,232,706 B1* | 5/2001 | Dai | ........................ | B82Y 10/00 313/309 |
| 7,400,159 B2* | 7/2008 | Wang | ..................... | B82Y 10/00 324/750.16 |
| 7,731,503 B2* | 6/2010 | Eldridge | ............ | G01R 1/06755 439/66 |
| 8,130,007 B2* | 3/2012 | Eldridge | ............ | G01R 1/06716 324/756.03 |
| 8,149,007 B2* | 4/2012 | Chen | ................... | G01R 1/06716 324/754.01 |

(Continued)

OTHER PUBLICATIONS

"Deformation mechanisms in nanotwinned metal nanopillars" by Jang et al. (Year: 2012).*

(Continued)

*Primary Examiner* — Paresh Patel
(74) *Attorney, Agent, or Firm* — Chun-Ming Shih; Lanway IPR Services

(57) ABSTRACT

A probe card includes a circuit board and a probe set. The probe set is electrically coupled to the circuit board. Also, the probe set includes a plurality of probes. Each of the plurality of probes includes a plurality of nanotwinned copper pillars that are arranged in a predetermined crystal orientation. In addition, each of the plurality of probes further includes a tip. The tip substantially and electrically contacts a chip. Such that the circuit board can test the chip via the tip.

14 Claims, 13 Drawing Sheets

(56) References Cited

U.S. PATENT DOCUMENTS

| | | | |
|---|---|---|---|
| 8,272,124 B2* | 9/2012 | Fang | G01R 1/06744 29/842 |
| 8,872,176 B2* | 10/2014 | Fang | B82Y 10/00 257/48 |
| 2011/0018566 A1* | 1/2011 | Crafts | G01R 1/07357 324/754.07 |
| 2012/0135260 A1* | 5/2012 | Jang | C25D 5/48 428/546 |

OTHER PUBLICATIONS

"Strain hardening and large tensile elongation in ultrahigh-strength nano-twinned copper" By Ma et al. (Year: 2004).*

Structure-Sensitive CO2 Electroreduction to Hydrocarbons on Ultrathin 5-fold Twinned Copper Nanowires by Li Y. et al. (Year: 2017).*

* cited by examiner

VERTICAL PROBE CARD

CROSS REFERENCE TO RELATED APPLICATION

This application claims the benefit of U.S. Provisional Application No. 62780932, filed on Dec. 18, 2018 and entitled "SEMICONDUCTOR TESTING DEVICE AND PACKAGE", the contents of which are incorporated herein by reference.

BACKGROUND OF THE INVENTION

1. Field of the Invention

The present invention relates to a vertical probe card, and more particularly, to a vertical probe card having strengthened probes.

2. Description of the Prior Art

A conventional vertical probe card performs necessary tests on manufactured semiconductor integrated circuit packages for confirming yields of such semiconductor integrated circuit packages. However, such conventional vertical probe card's probes may not be strong enough to survive highly repeated usage. For example, the probes may deform themselves because of such highly repeated usage.

SUMMARY OF THE INVENTION

The present disclosure aims at disclosing a vertical probe card to neutralize the conventional probe card's weakness in strength.

In one embodiment, the disclosed vertical probe card includes a circuit board and a probe set. The probe set is electrically coupled to the circuit board. Also, the probe set includes a plurality of probes. Each of the plurality of probes includes a plurality of nanotwinned copper pillars that are arranged in a predetermined crystal orientation. In addition, each of the plurality of probes further includes a tip. The tip substantially and electrically contacts a chip. Such that the circuit board can test the chip via the tip.

In one example, the predetermined crystal orientation may be (1,1,1), (1,2,1), or (2,2,2).

In one example, the circuit board transmits a test signal to the chip via the tip. Also, the circuit board receives a response signal from the chip via the tip. In addition, the response signal is generated in response to the test signal. In one example, the circuit board analyzes the response signal to diagnose a yield status of the chip.

In one example, each of the plurality of probes includes a stud at its one terminal. The stud detachably engages the probe to the circuit board. Such that the probe is relatively unmovable with the circuit board.

In one example, the stud includes a shape of, for example, a cylinder, a cone, or a polyhedron.

In one example, each of the plurality of probes includes a shape of, for example, a cuboid, a cylinder, or a curved cylinder.

In one example, the tip includes a flat surface that substantially contacts the chip.

In one example, the tip includes a cone body and a pinpoint that connects the cone body. Also, the pinpoint substantially contacts the chip.

In one example, the tip includes a capped cone body and a flat pinpoint that connects the capped cone body. The flat pinpoint substantially contacts the chip.

In one example, the tip is pillar-shaped.

In one example, the tip is curve-shaped.

In one example, each of the plurality of probes includes a coat layer that substantially coats each of the plurality of probes.

In one example, the coat layer is made of metal and/or an organic material.

In one example, each of the plurality of probes includes a plurality of coat layers that substantially coat each of the plurality of probes.

In one example, each of the plurality of coat layers is made of metal and/or an organic material.

In one example, the circuit board further includes a lateral holder that abuts the circuit board.

In one example, the plurality of nanotwinned copper pillars are fabricated by chemical plating.

These and other objectives of the present invention will no doubt become obvious to those of ordinary skill in the art after reading the following detailed description of the preferred embodiment that is illustrated in the various figures and drawings.

DETAILED DESCRIPTION

As mentioned above, the present disclosure discloses a vertical probe card having strengthened probes. The disclosed vertical probe card can better survive highly repeated usage and is less likely to deform, in comparison to the conventional vertical probe card.

Figure 1:
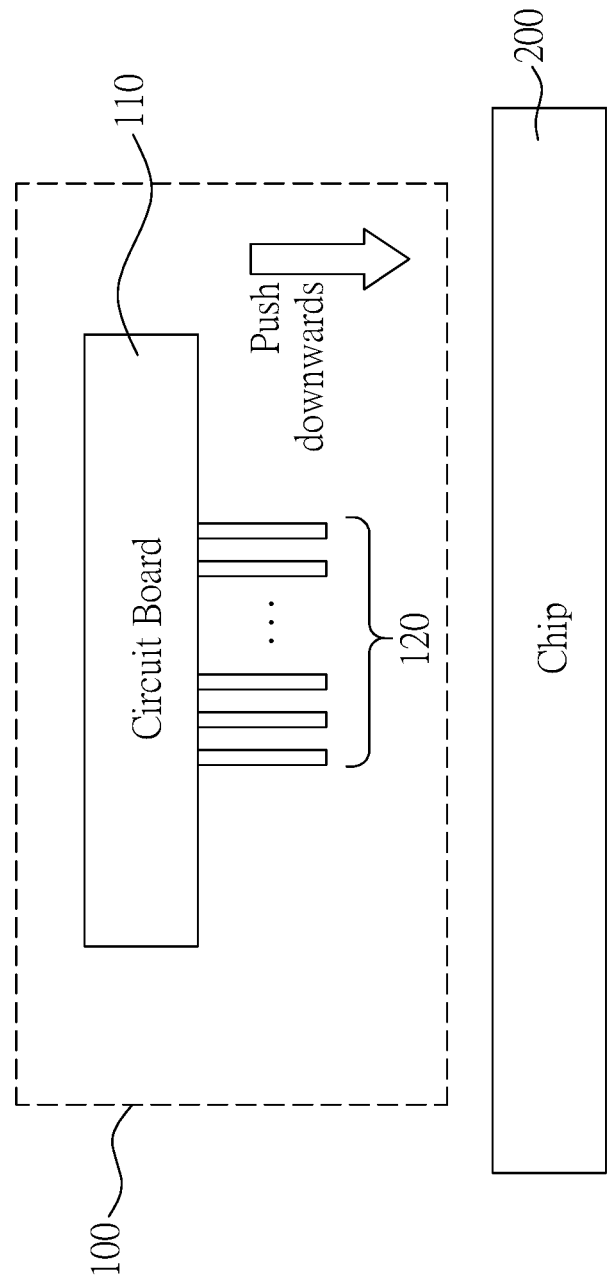
FIG. 1 and FIG. 2 illustrate a basic structure of a vertical probe card according to one embodiment of the present disclosure.
Figure 2:
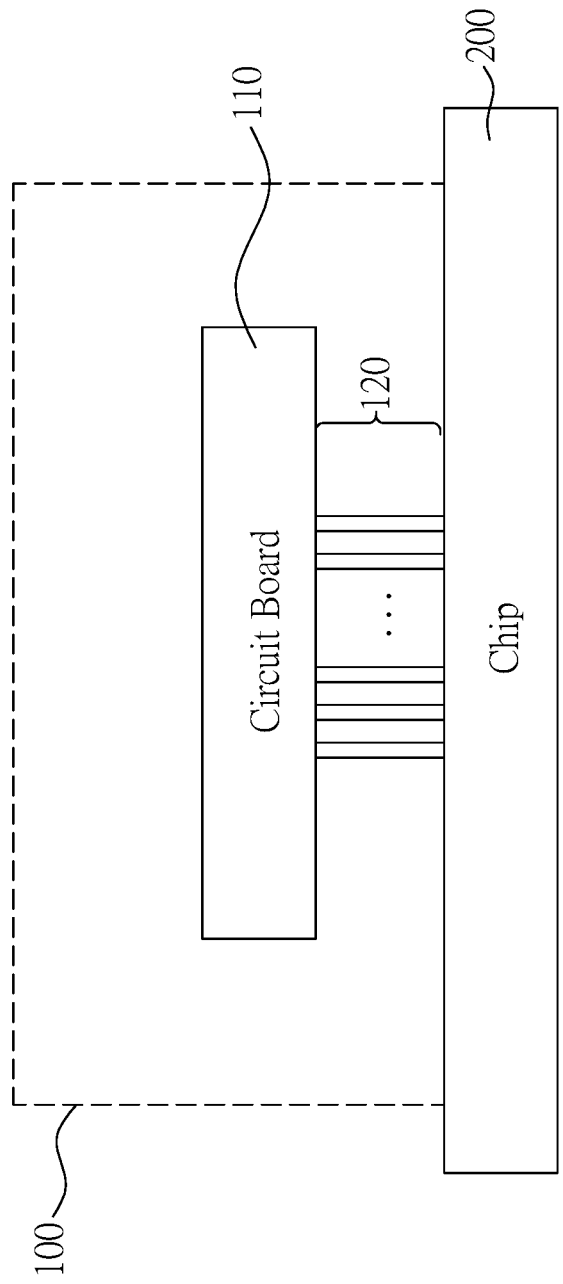

Please refer to FIG. 1 and FIG. 2, which illustrate a basic structure of a vertical probe card 100 according to one embodiment of the present disclosure. The vertical probe card 100 includes a circuit board 110 and multiple probes 120.

When the vertical probe card 100 is pushed to electrically contact a chip 200, the vertical probe card 100 is capable of testing the chip 200's operations to confirm if the chip 200 is defective. More specifically, the multiple probes 120 electrically are pushed to contact the chip 200, such that the circuit board 110 can send test signals to the chip 200 via the multiple probes 120. While the chip 200 is tested, the chip 200 also generates response signals and feedbacks the response signals to the circuit board 110 via the multiple probes 120. In this way, the circuit board 110 can confirm if the chip 200 operates normally (i.e., the chip 200's yield status) by analyzing the response signals.

Figure 3:
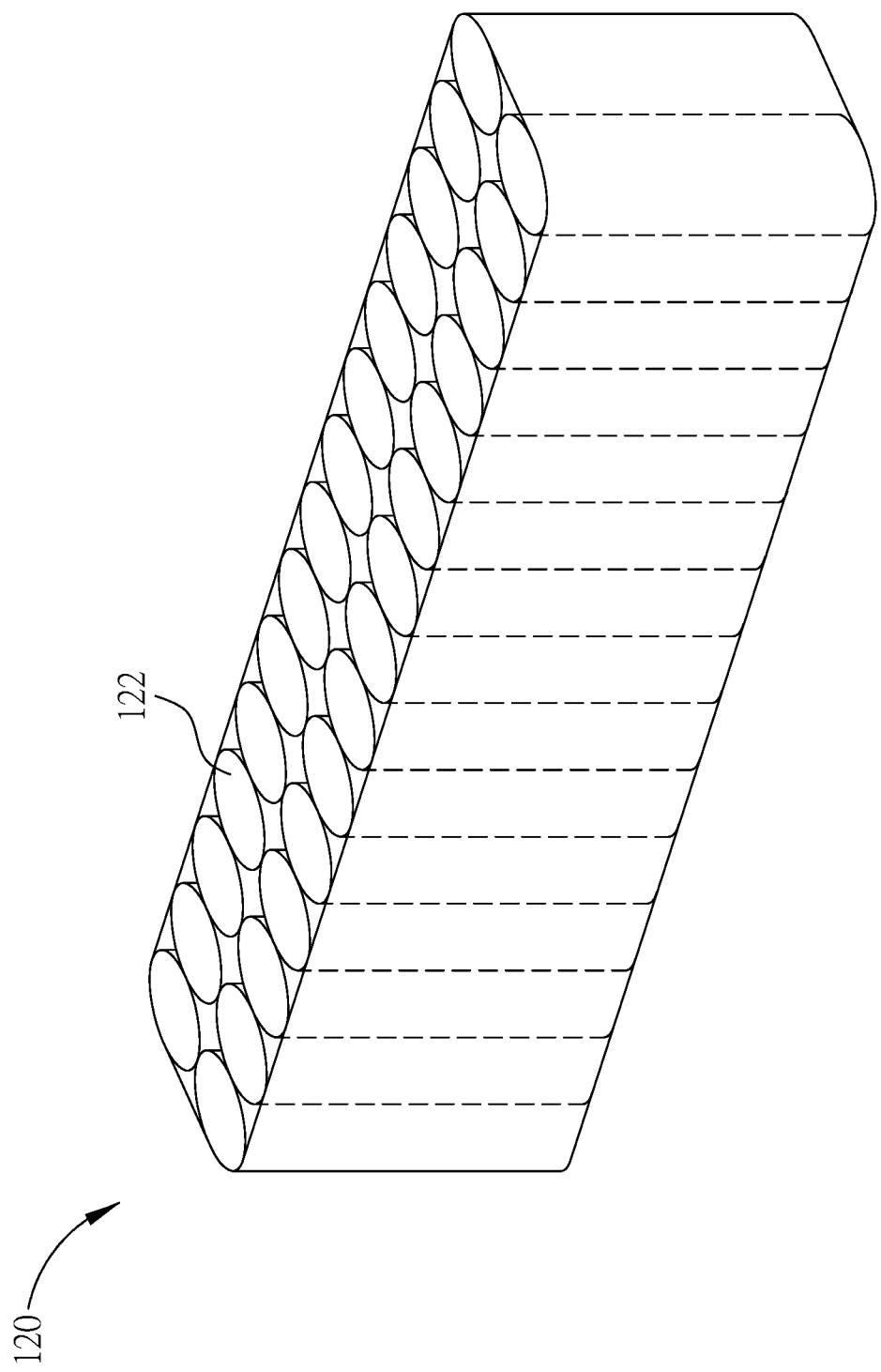
FIG. 3 and FIG. 4 illustrate examples of an internal structure of a probe shown in FIGS. 1-2.
Figure 4:
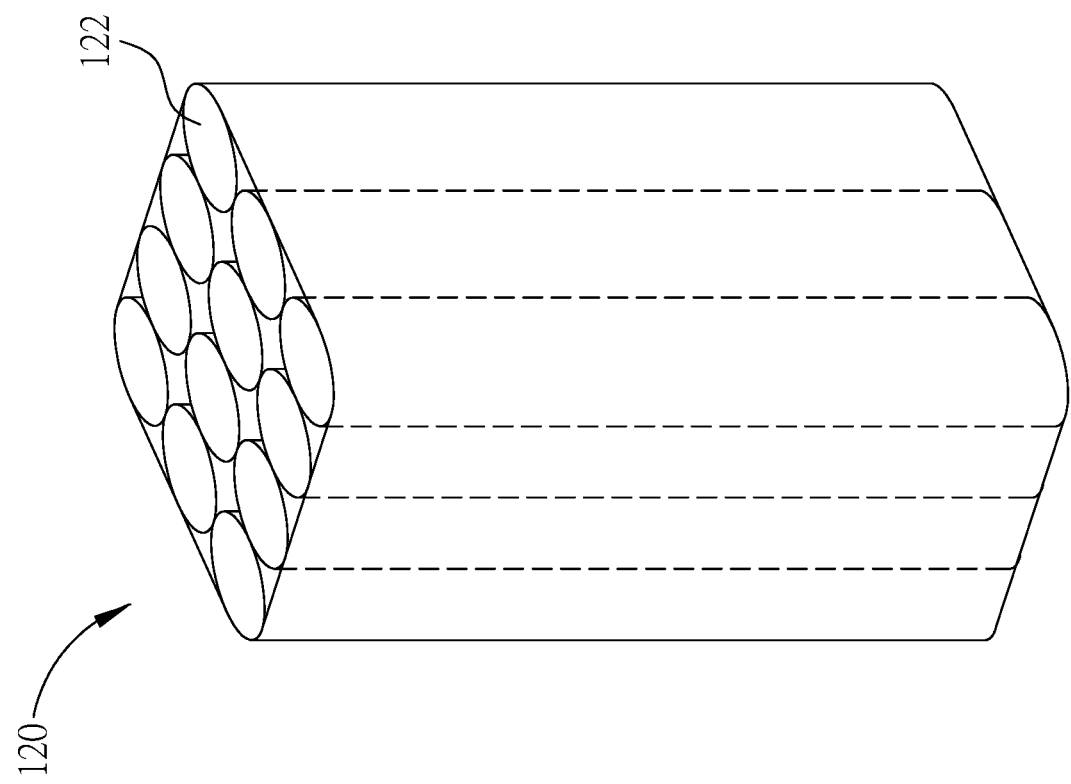

However, as mentioned previously, if the multiple probes 120's strength is not strong enough, the probes 120 may not survive highly repeated usage of testing large amounts of chips 200, or even deform itself. For overcoming such disadvantage, each of the probes 120 is made of multiple nanotwinned (NT) copper pillars that are tightly arranged in a predetermined crystal orientation. FIG. 3 and FIG. 4 illustrate examples of a probe 120's internal structures.

As illustrated, each the probe 120 includes multiple NT copper pillars 122 that are tightly bound to each other. Also, the probes 120's strength is significantly improved with the aid of NT copper materials.

In fact, NT copper materials' Young modulus can reach at least 100 GPa. This fact guarantees that each the NT copper pillars 122 has a high resistance against an external force, such that each the NT copper pillars 122 will not deform easily. In addition, the NT copper materials have sufficient elongation, such that the NT copper pillars 122 are unlikely to deform themselves. Also, the NT copper materials have good resistance against chemical erosions, such that the NT copper pillars 122 are unlikely eroded while the vertical probe card 100 are used for chemical tests.

In some examples, the NT copper pillars 122 are made via chemical plating or electroplating, and more particularly, by following a predetermined crystal orientation. Optionally, such chemical plating or electroplating may further incorporate organic materials, alloy, or graphene. In this way, the NT copper pillars 122 may also have low electronic resistance. Moreover, such chemical plating or electroplating may apply an AC current or a DC current for better efficiency to fabricate each the NT copper pillars 122.

In some examples, the NT copper pillars 122 may be made of a short scale or a large scale. In some examples, as illustrated in FIG. 3, the short scale of the NT copper pillars 122 may include ranges of about 40 micrometers in height and/or to 100 micrometers in width. In some examples, as illustrated in FIG. 4, the large scale of the NT copper pillars 122 may include ranges of about 1-5 millimeters in height and/or 5 to 100 micrometers in width. Variations of such scales of the NT copper pillars 122 still compose embodiments of the present disclosure.

By arranging the multiple NT copper pillars 122 in a predetermined crystal orientation to generate the probe 120, each the probe 120 has a sufficient strength to resist highly repeated usage in testing chips 200.

In some examples, the predetermined crystal orientation may be (1,1,1), (1,2,1), or (2,2,2).

In some examples, when each the probe 120 is made via the (1,1,1) crystal orientation, each the probe 120 may have better electric, mechanical and thermal-stability properties than the other crystal orientations. For example, the (1,1,1) crystal orientation may render each the probe 120 to stand an annealing temperature of 300 degrees Celsius for at least one hour, without serious de-twinning or grain growth.

Figure 5:
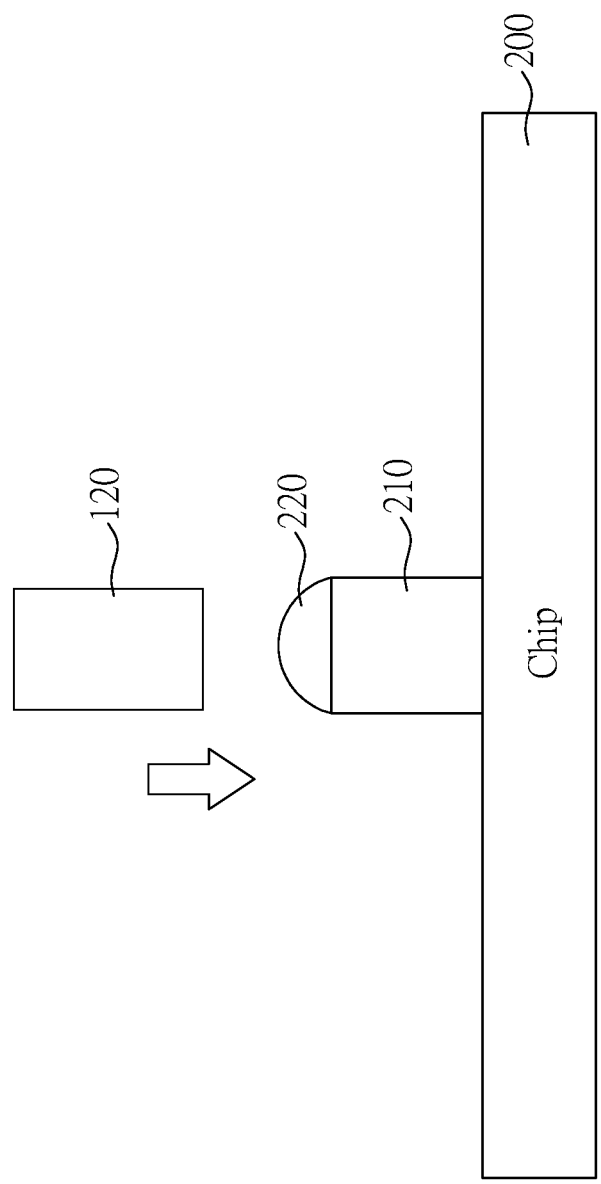
FIG. 5 illustrates an exemplary diagram of the chip shown in FIGS. 1-2.

FIG. 5 illustrates an exemplary diagram of the chip 200 that is being approached by a probe 120. Specifically, in some example, the chip 200 may further include a solder pin 220 and a conductive pillar 210 that supports the solder pin 220. Such that the approaching probe 120's tip can be electrically coupled to the chip 200 via the solder pin 220 and the conductive pillar 210 for required tests. Also, the support pillar 210 may also be made of NT copper pillars, e.g., via the same way that fabricates each the probe 120. Such that the support pillar 210 may also have the strength to survive repeated tests.

In some examples, the multiple probes 120 may have shapes of, for example, a cuboid, a cylinder or a curved cylinder.

Additionally, in some examples, the multiple probes 120's tip may also have various shapes.

In one example, each the probe 120's tip may have a flat surface that is electrically coupled to the chip 200's surface, as illustrated in FIG. 2.

Figure 6:
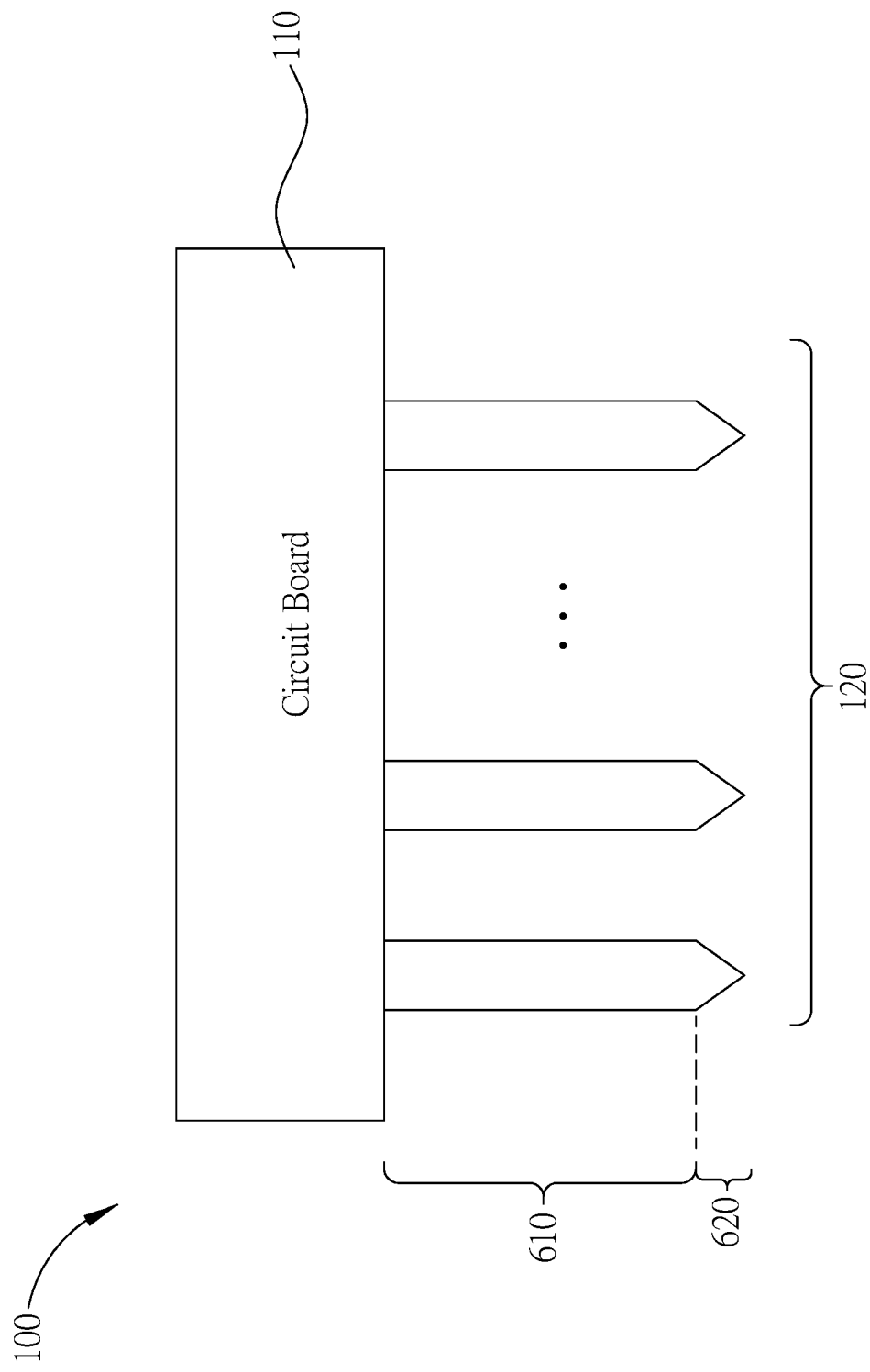
FIG. 6 illustrates an exemplary probe shown in FIGS. 1-2 that includes a cone body and a pinpoint at its tip.

In one example, each the probe 120's tip has a cone body 610 and a pinpoint 620, as illustrated in FIG. 6. The pinpoint 620 connects the cone body 610. Also, the pinpoint 620 is used for substantially contact the chip 200 for required tests.

Figure 7:
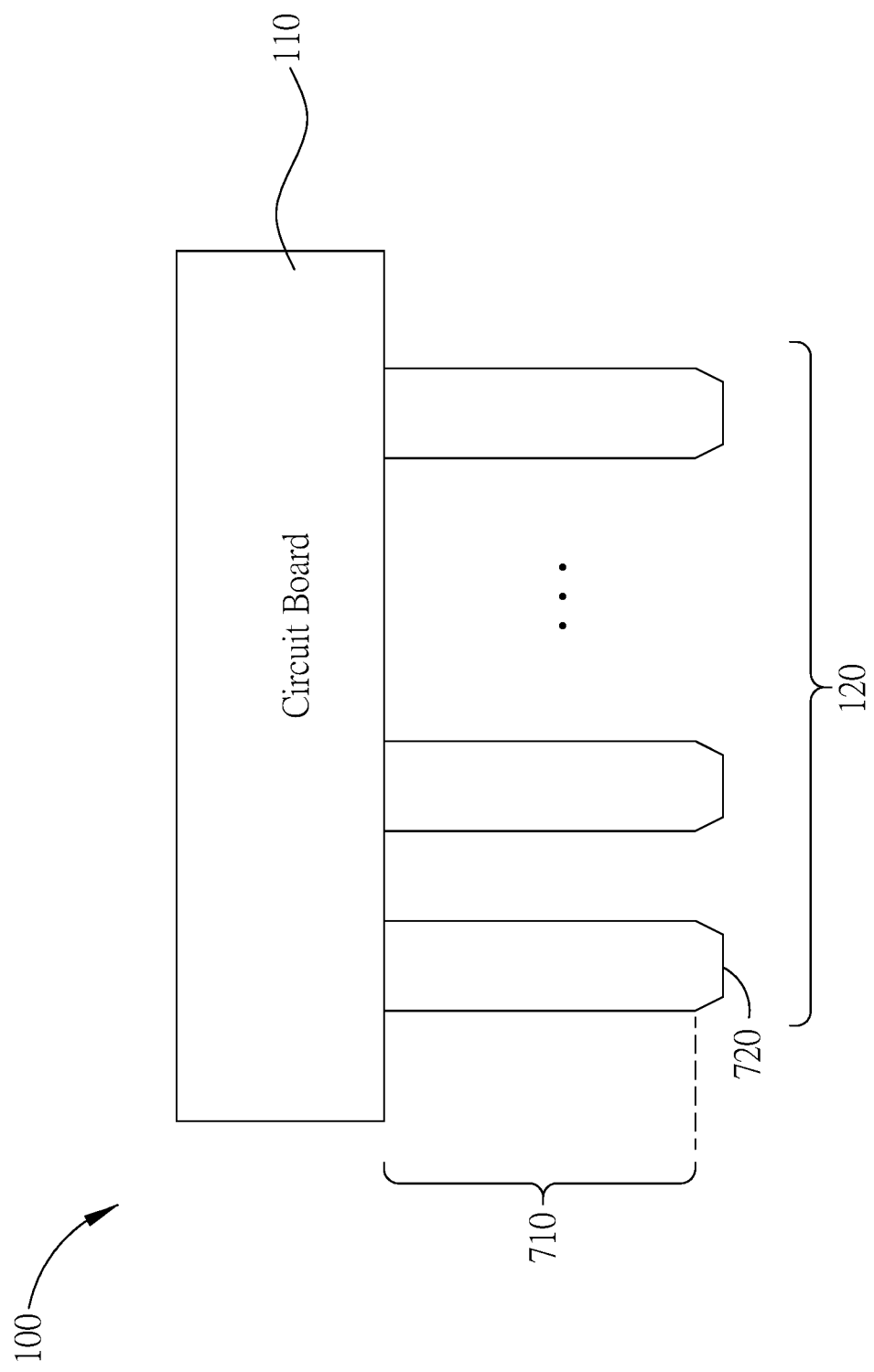
FIG. 7 illustrates an exemplary probe shown in FIGS. 1-2 that includes a capped cone body and a flat pinpoint at its tip.

In one example, each the probe 120's tip has a capped cone body 710 and a flat pinpoint 720, as illustrated in FIG. 7. The flat pinpoint 720 connects the capped cone body 710. Additionally, the flat pinpoint 720 substantially contact the chip 200 for required tests.

Figure 8:
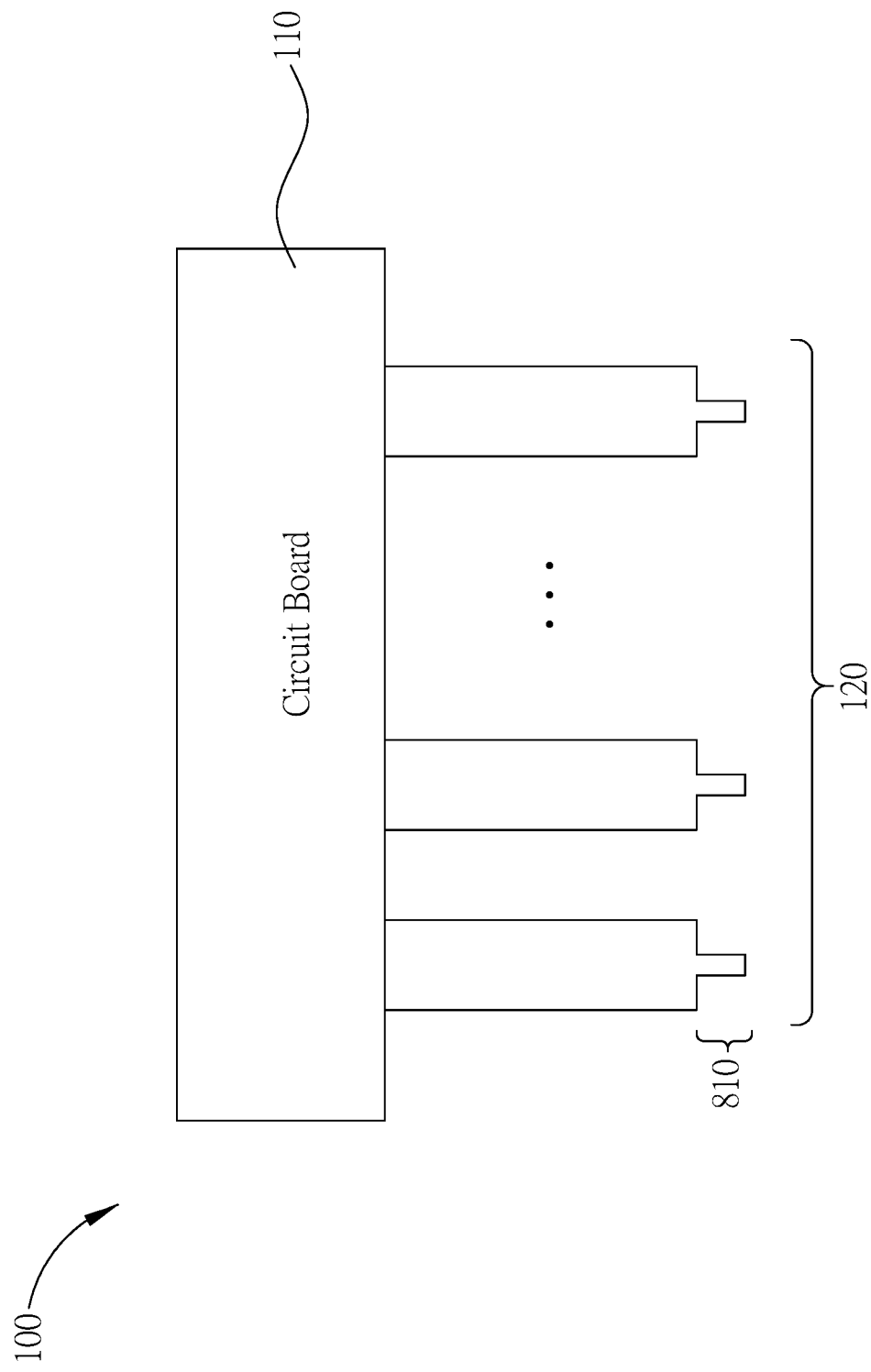
FIG. 8 illustrates an exemplary probe shown in FIGS. 1-2 that includes a pillar-shaped tip.

In one example, each the probe 120's tip is pillar-shaped, e.g., a pillar-shaped tip 810 illustrated in FIG. 8.

Figure 9:
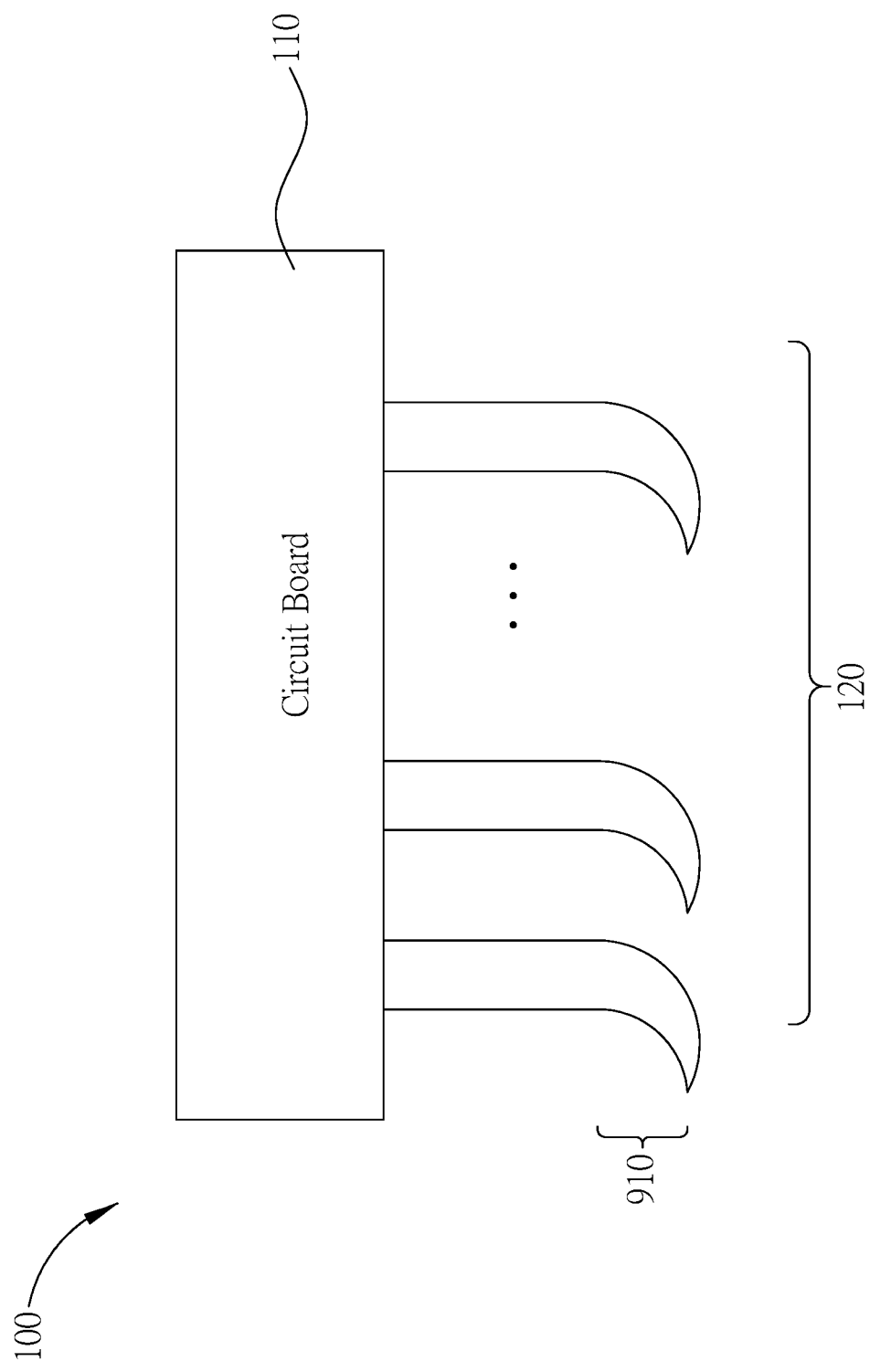
FIG. 9 illustrates an exemplary probe shown in FIGS. 1-2 that includes a curve-shaped tip.

In one example, each the prove 120's tip is curve-shaped, e.g., a curved-shaped tip 910 illustrated in FIG. 9.

For better fixing the probe 120 to the circuit board 110, in some examples, the probe 120 may further include at least one lateral support that abuts and engages the at least one lateral support respectively.

Figure 10:
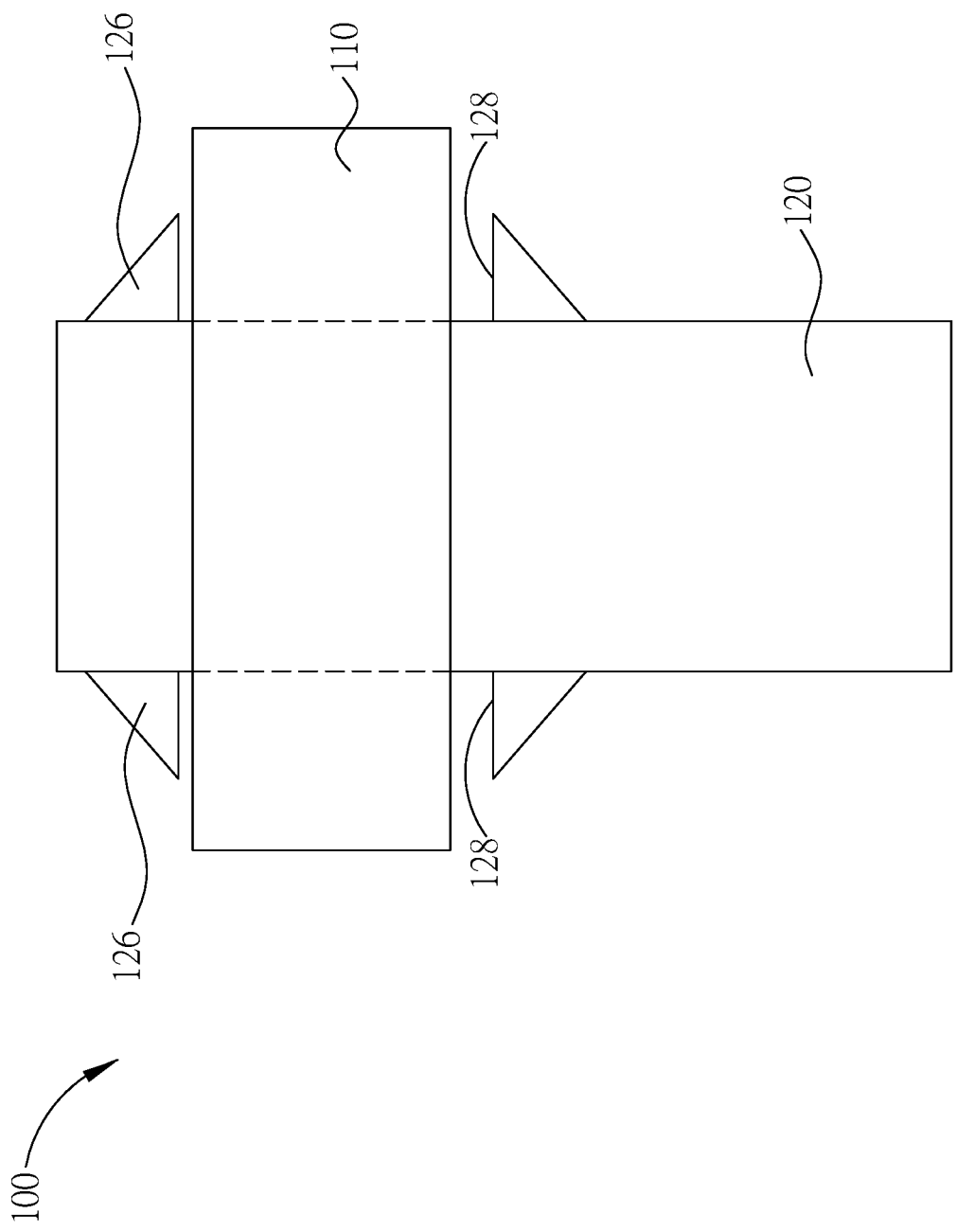
FIG. 10 illustrates an exemplary vertical probe card shown in FIGS. 1-2 that includes at least one pair of lateral supports.
Figure 11:
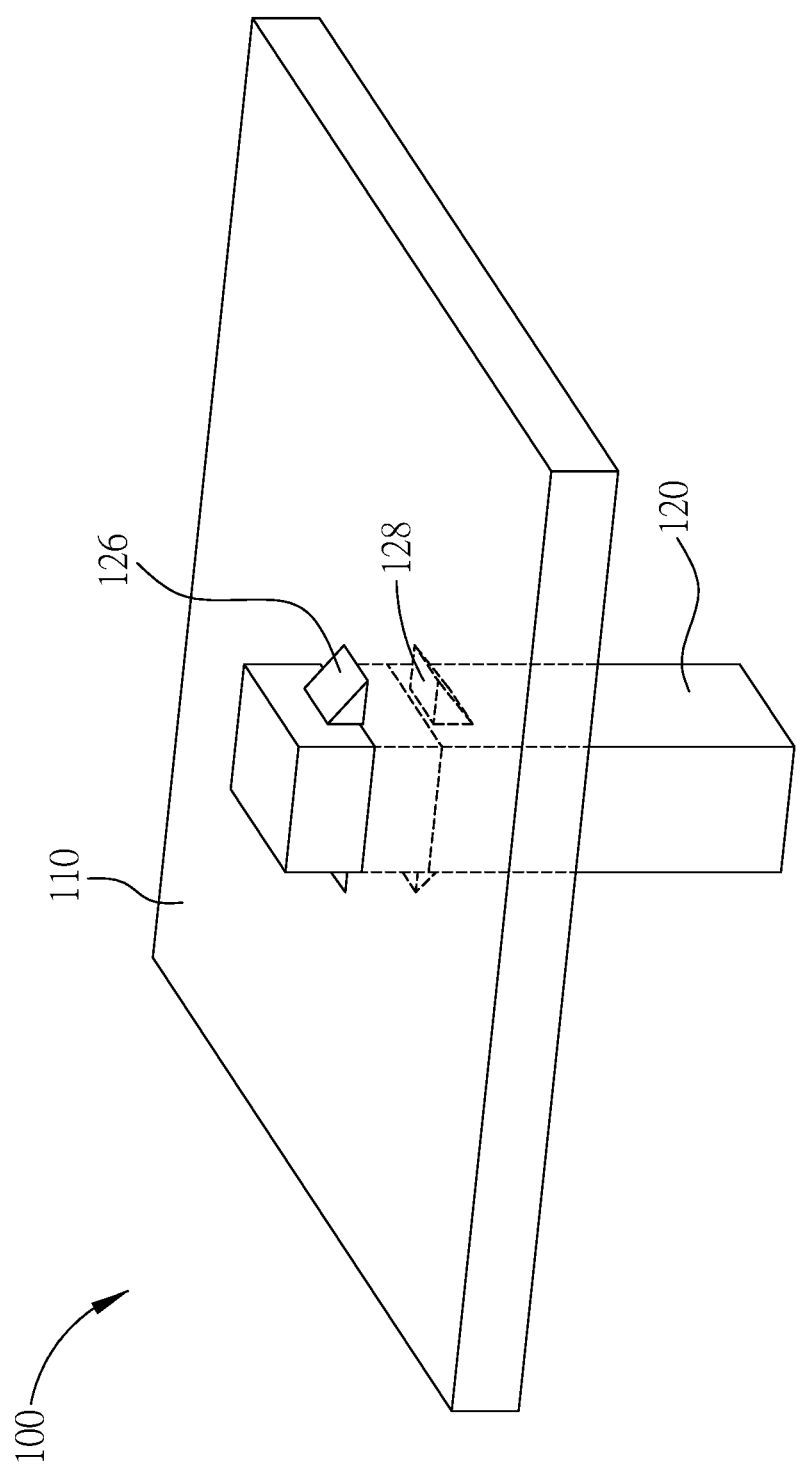
FIG. 11 illustrates an exemplary 3D diagram of how the lateral supports shown in FIG. 10 abut and engage with the circuit board.

FIG. 10 illustrates an exemplary vertical probe card 100 that includes at least one pair of lateral holders. Specifically, the probe 120 may include some pairs of lateral supports 126 and 128. In addition, each lateral support 126 and/or 128 abut and engage with the circuit board 110. Such that the probe 120 better engages with the circuit board 110 in a relatively unmovable manner. FIG. 11 illustrates a 3D diagram of how the lateral supports 126 and/or 128 abut and engage with the circuit board 110.

Figure 12:
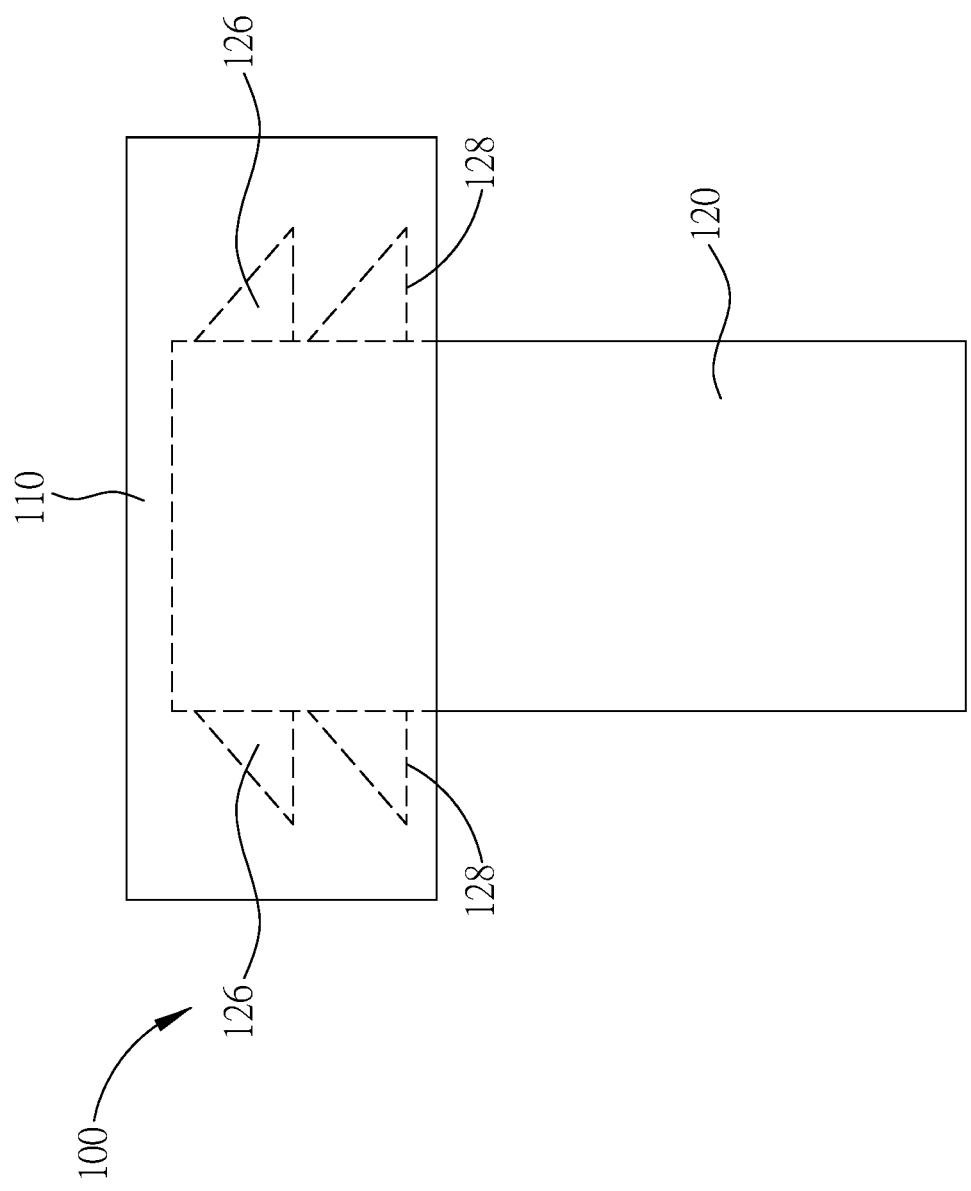
FIG. 12 illustrates an exemplary vertical probe card shown in FIGS. 1-2 that includes some pairs of lateral supports.

Similarly, FIG. 12 illustrates an exemplary vertical probe card 100 that includes two pairs of lateral supports 126 and 128 that render the circuit board 110 and the probe 120 to be mutually unmovable. Specifically, the circuit board 110 may include some pairs of lateral supports 126 and 128 for better mutual engagement, in comparison to the vertical probe card 100 shown in FIG. 10.

Figure 13:
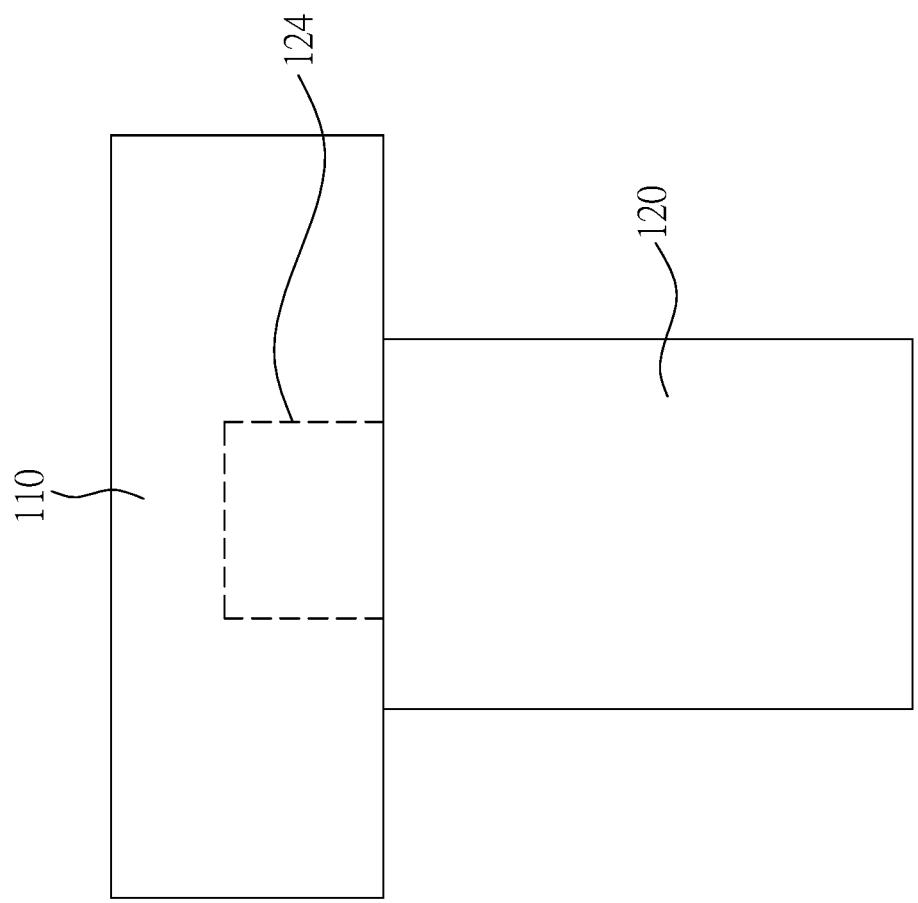
FIG. 13 illustrates an exemplary diagram of a vertical probe card shown in FIGS. 1-2 that applies a stud at its probe's top side.

In some examples, the probe 120 may further include a stud at its top side for detachably engage the probe 120 to the circuit board 110. Such that the probe 120 is relatively unmovable with the circuit board 110. FIG. 13 illustrates an exemplary diagram of a vertical probe card 100 that applies a stud 124 at the probe 120's top side. The stud 124 substantially engages the probe 120 to the circuit board 110, such that the probe 120 cannot move with respect to the circuit board 110. In some examples, the stud 124 has a shape of a cylinder, a cone, or a polyhedron.

In some examples, the multiple probes 120 is coated with a coat layer, for example, for protecting each the probe 120. Additionally, the coat layer may be made of metal and/or an organic material, or even graphene. Such coat layer provides the probes 120 better resistance against at least heat, chemical erosion (such as acid), and pressure.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A vertical probe card, comprising:
a circuit board; and
a probe set, electrically coupled to the circuit board, wherein the probe set comprises a plurality of probes, each of the plurality of probes comprises a plurality of nanotwinned copper pillars that are arranged in a predetermined crystal orientation;
wherein each of the plurality of probes further comprises a tip, which is configured to substantially and electrically contact a chip, such that the circuit board is configured to test the chip via the tip.

2. The vertical probe card of claim 1, wherein the predetermined crystal orientation comprises a group selected from (1,1,1), (1,2,1), and (2,2,2).

3. The vertical probe card of claim 1, wherein the circuit board is further configured to transmit a test signal to the chip via the tip; and
wherein the circuit board is further configured to receive a response signal from the chip via the tip; and
wherein the response signal is generated in response to the test signal.

4. The vertical probe card of claim 3, the circuit board is further configured to analyze the response signal to diagnose a yield status of the chip.

5. The vertical probe card of claim 1, wherein each of the plurality of probes comprises a stud, which is configured to detachably engage the probe to the circuit board, such that the probe is relatively unmovable with the circuit board.

6. The vertical probe card of claim 5, wherein the stud comprises a shape selected from the following group: a cylinder, a cone, and a polyhedron.

7. The vertical probe card of claim 1, wherein each of the plurality of probes comprises a shape selected from the following group: a cuboid, a cylinder and a curved cylinder.

8. The vertical probe card of claim 1, wherein the tip comprises a flat surface, which is configured to substantially contact the chip.

9. The vertical probe card of claim 1, wherein the tip comprises a cone body and a pinpoint that connects the cone body, wherein the pinpoint is configured to substantially contact the chip.

10. The vertical probe card of claim 1, wherein the tip comprises a capped cone body and a flat pinpoint that connects the capped cone body, wherein the flat pinpoint is configured to substantially contact the chip.

11. The vertical probe card of claim 1, wherein the tip is pillar-shaped.

12. The vertical probe card of claim 1, wherein the tip is curve-shaped.

13. The vertical probe card of claim 1, wherein the each of the plurality of probes further comprises a lateral support, which is configured to abut and engage the circuit board.

14. The vertical probe card of claim 1, wherein the plurality of nanotwinned copper pillars are fabricated by chemical plating.

* * * * *